US012805336B2

(12) United States Patent
Zhang et al.

(10) Patent No.: US 12,805,336 B2
(45) Date of Patent: Nov. 17, 2026

(54) CHIP PACKAGING STRUCTURE

(71) Applicant: Chengdu Sicore Semiconductor Corp. Ltd., Chengdu (CN)

(72) Inventors: Cemin Zhang, Chino, CA (US); Hongzhan Guo, Chengdu (CN)

(73) Assignee: Chengdu Sicore Semiconductor Corp.Ltd., Sichuan (CN)

( * ) Notice: Subject to any disclaimer, the term of this patent is extended or adjusted under 35 U.S.C. 154(b) by 385 days.

(21) Appl. No.: 18/430,600

(22) Filed: Feb. 1, 2024

(65) Prior Publication Data

US 2025/0118688 A1 Apr. 10, 2025

(30) Foreign Application Priority Data

Oct. 7, 2023 (CN) ......................... 202311285070.1

(51) Int. Cl.

| | |
|---|---|
| ***H10W 44/20*** | (2026.01) |
| ***H10W 20/41*** | (2026.01) |
| ***H10W 20/42*** | (2026.01) |
| ***H10W 70/40*** | (2026.01) |
| ***H10W 70/65*** | (2026.01) |
| ***H10W 70/685*** | (2026.01) |
| ***H10W 80/00*** | (2026.01) |

(52) U.S. Cl.

CPC ........... *H10W 44/20* (2026.01); *H10W 20/42* (2026.01); *H10W 20/427* (2026.01); *H10W 70/40* (2026.01); *H10W 70/411* (2026.01); *H10W 70/421* (2026.01); *H10W 70/65* (2026.01); *H10W 70/685* (2026.01); *H10W 44/209* (2026.01); *H10W 80/301* (2026.01)

(58) Field of Classification Search

CPC . H10W 44/20; H10W 44/203; H10W 44/209; H10W 70/40; H10W 70/411; H10W 70/421; H10W 80/301; H10W 80/312

See application file for complete search history.

(56) References Cited

U.S. PATENT DOCUMENTS

| | | | | |
|---|---|---|---|---|
| 7,132,747 | B2 * | 11/2006 | Kwon ................. | H10W 40/778<br>257/E25.031 |
| 7,622,793 | B2 * | 11/2009 | Anderson ............ | H10W 44/20<br>257/659 |
| 9,806,043 | B2 * | 10/2017 | Lee ......................... | H10P 54/00 |
| 10,109,584 | B2 * | 10/2018 | Jow .......................... | H10D 1/20 |

(Continued)

*Primary Examiner* — David A Zarneke

(74) *Attorney, Agent, or Firm* — Michael North

(57) ABSTRACT

The present invention discloses chip packaging structure embodiments. The chip packaging structure may comprise a chip, at least one RF bonding plate, and a ground bonding plate. The ground bonding plate has at least one groove facing the at least one RF bonding plate; the RF bonding plate has a protruding section extending, with a gap, into one groove; an RF connection terminal on a front side of the chip reaches a back side of the chip through an RF metal via and connects to the protruding section of one RF bonding plate. Ground connection terminals on the front side of the chip reach the back side of the chip through ground metal vias and connect to the ground bonding plate. The present invention solves the problem of performance degradation in traditional WB packaging under high frequencies and high complexity and cost in FC packaging processes.

20 Claims, 12 Drawing Sheets

(56) References Cited

U.S. PATENT DOCUMENTS

| | | | | |
|---|---|---|---|---|
| 11,791,312 | B2 * | 10/2023 | Ketterson | H10W 20/20 257/728 |
| 12,341,133 | B2 * | 6/2025 | Zhang | H01P 1/047 |
| 2020/0176416 | A1 * | 6/2020 | Ketterson | H10W 20/20 |
| 2021/0183722 | A1 * | 6/2021 | Anderson | H10P 54/00 |
| 2024/0194413 | A1 * | 6/2024 | Fisher | H01G 4/40 |

* cited by examiner

CHIP PACKAGING STRUCTURE

CROSS-REFERENCE TO RELATED APPLICATIONS

This application claims foreign priority to Chinese Patent Application No. 202311285070.1, entitled “A CHIP PACKAGING STRUCTURE”, naming Cemin Zhang and Hongzhan Guo as inventors, and filed Oct. 7, 2023, the subject matter of which is hereby incorporated herein by reference.

BACKGROUND

A. Technical Field

The present invention generally relates to chip packaging and, more particularly, to a type of chip packaging structure.

B. Background of the Invention

Microwave and millimeter wave chip packaging mainly includes two types: lead frame-type packaging and substrate-type packaging. Lead frame-type packaging typically uses Quad Flat No-leads Package (QFN), which is one of the surface mount packaging types. Given QFN’s good electrical and thermal performance, compact size, and lightweight, it is widely used in the packaging of digital and analog devices. QFN packaging has no leads, takes square or rectangular shape, with a large exposed solder pad located in the center on the bottom of a QFN package, and places I/O pins around the large solder pad on the outer perimeter of the package. Due to a short conductive path between internal pins and solder pad in the QFN package, the inductance coefficient and the parasitic resistance inside the package are very low, which leads to excellent electrical performance. In addition, the exposed frame bonding plate results in outstanding heat dissipation performance.

Substrate-type packaging uses substrate as a base layer for chip packaging, providing electric connection, protection, support and heat dissipation for the dies. Substrates, with advantages in thinness, fine circuit lines, and high integration, are therefore widely used in many fields, including the new generation of mobile communication, artificial intelligence, automotive electronics, and defense equipment.

The chip connection of the above two packaging types mainly uses two methods: Wire Bonding (WB) and Flip Chip (FC). Wiring, also referred to as Wire Bonding (Pressure Welding, Binding, Bonding, or Wire Welding), is a process of using metal wires (e.g., gold wires, or aluminum wire, etc.) to create internal interconnection within solid-state circuits in microelectronic devices, i.e., interconnections between chips and circuits or lead frames. Flip chip has a pinless structure, typically containing circuit units, electrically and mechanically connected through a desired number of tin balls (covered by conductive adhesive) located on its surface. Flip chip involves depositing tin-lead balls on the I/O pad, flipping the chip followed by chip heating, and using the melted tin-lead balls to bond with a ceramic substrate. This technique is an alternative to conventional wire bonding.

However, for contemporary new radio frequency (RF) or microwave devices, the working frequency requirements are getting higher, even exceeding 50 GHz. For traditional WB (Wire Bonding) packaging, the high-frequency parasitic effects of gold wires are significant; whereas for FC packaging, bumping the chip is required. Bumping refers to the copper-tin or gold protrusions (bumping) made on the surface of a wafer in the FC process. After the chip is flipped and attached to a printed circuit board (PCB), the bumping protrusions connect with the conductive solder pads on the PCB. The aforementioned bumping process is relatively complex and bears high cost.

SUMMARY OF THE INVENTION

The present invention provides solutions to the problem of performance degradation in traditional WB under high working frequency, and the high complexity and cost in FC packaging processes.

To achieve the above purpose, the present invention provides a chip packaging structure comprising: a chip; at least one radio frequency (RF) bonding plate; and a ground bonding plate; wherein the ground bonding plate has at least one groove corresponding to the at least one RF bonding plate, each of the at least one RF bonding plate has a protruding section extending, with a gap, into one of the at least one groove; the chip has an RF connection terminal, on a front side of the chip, reaching a back side of the chip through an RF metal via and connecting to the protruding section of the at least one RF bonding plate; the chip comprises one or more ground connection terminals, on the front side of the chip, reaching the back side of the chip through one or more ground metal vias and connecting to the ground bonding plate.

Wherein, the chip packaging structure further comprises lead frames or substrates, the at least one RF bonding plate and the ground bonding plate are located on the lead frames or substrates, the chip is attached to the lead frames or substrates.

In the present invention, the chip is directly bonded to frames or substrates with electric connections via circuit lines on the back of the dies. Because the IC bare dies are directly bonded on QFN frames or substrates, it eliminates high-frequency parasitic effects, can therefore be used under higher frequency levels, which solves performance degradation of traditional WB under high working frequency requirements. Also, the method of direct bonding of IC bare dies to the frames or substrates does not require bumping as in FC packaging. The method is simpler in processing, is lower in cost, and solves the problems of process complexity and high cost in traditional FC packaging processes.

In order to directly bond a bare IC chip on the frames and substrates, the present invention discloses an approach wherein an RF connection terminal, on a front side of a chip, reaches a back side of the chip through an RF metal via for the convenience of connecting to a protruding section of the at least one RF bonding plate, and wherein one or more ground connection terminals, on the front side of the chip, reach the back side of the chip through one or more ground metal via for the convenience of connecting to the ground bonding plate.

Wherein, the purpose of having a groove on the ground bonding plate to surround the RF bonding plate and having a protruding section of the RF bonding plate surrounded by the ground bonding plate is to form a Ground-Signal-Ground (GSG) structure for the RF bonding plate and the ground bonding plate, hence improving impedance matching between the bare chip and the chip packaging structure for high frequency band.

Wherein, the purpose of using a gap between the protruding section of the RF bonding plate and the corresponding groove is to form a GSG structure for the RF bonding plate and the ground bonding plate, hence improving RF performance.

Wherein, in the chip packaging disclosed structure, a grounding metal via is disposed on each of opposite sides of the RF metal via connected to the protruding section of the at least one RF bonding plate. The purpose of such a design is for the ground bonding plate to surround the RF bonding plate from both the left and right sides, hence forming a GSG structure to improve compatibility of signals at millimeter wave frequencies.

Wherein, the disclosed chip packaging structure comprises a conductive bonding plate, which may be connected to the chip. The conductive bonding plate is used for low-frequency signal connection, and may be interconnected with the IC chip through Wire Bonding to provide bias voltage or logic control for the chip.

Wherein, the disclosed chip packaging structure comprises a double-layer substrate with the RF bonding plate and the ground bonding plate placed at the top layer of the double-layer substrate. Such a layout allows a direct bonding to the bare IC chip.

Wherein, the disclosed chip packaging structure comprises a lead frame or a substrate on which the chip is bonded. The RF bonding plate and the ground bonding plate are located at fixed locations corresponding to the lead frame or the substrate.

Wherein, the disclosed chip packaging structure comprises three RF bonding plates and three grooves. Each RF bonding plate is paired with one groove. This type of packaging structure has a wide range of applications, including 2-port devices such as attenuators, filters etc., or 3-port devices such as mixers, power splitters, switches, etc.

Wherein, the disclosed chip packaging structure further comprises a conductive bonding plate connected to the chip. The three RF bonding plates face three sides out of four sides of the structure respectively. The conductive bonding plate faces the remaining one side of the structure. The three RF bonding plates are located on three separate sides because attenuators and filters have their RF connection terminals located on the opposite sides; and mixers, power splitters, and switches have their RF connection terminals located on three different sides. The placing of conductive bonding plates and RF bonding plates on different sides enhances isolation for improved performance.

Wherein, the number of conductive bonding plate is one or more. The number is purposefully designed such that the conductive plates may be connected to an IC bare chip for usage on a wide range of applications such as controllable switches, attenuators, etc.

Wherein, the protruding section of the RF bonding plate extends towards the center of ground bonding plate. The ground bonding plate and RF bonding plate forms a GSG structure, which improves a matching between the IC bare chip and the chip packaging structure, and thus suitable for higher frequency bands.

Wherein, there is a gap between the conductive bonding plate and the ground bonding plate. The purpose of having such a gap is also forming a GSG structure to enhance the RF performance.

The present invention discloses one or more technical schemes that have at least the following technical improvements or advantages:

In the present invention, an RF connection terminal of an IC chip is directly bonded onto QFN lead frame or substrate through a back-side RF wiring to avoid the high-frequency parasitic effects of gold wires; thus, it can be used under higher working frequencies.

In the present invention, an IC chip is directly bonded. Compared with FC packaging, such a direct bonding does not require bumping on bare chip. Hence, the process is simpler and the cost is lower.

In the present invention, three RF bonding plates are used for broader applications, including 2-port and 3-port chips.

BRIEF DESCRIPTION OF THE DRAWINGS

Reference will be made to exemplary embodiments of the present invention that are illustrated in the accompanying figures. Those figures are intended to be illustrative rather than limiting.

FIG. 2 is bonded onto the structure shown in FIG. 3 and FIG. 4.

FIG. 8 is bonded on the substrate shown in FIG. 9 and FIG. 10.

DETAILED DESCRIPTION

Figure 1:
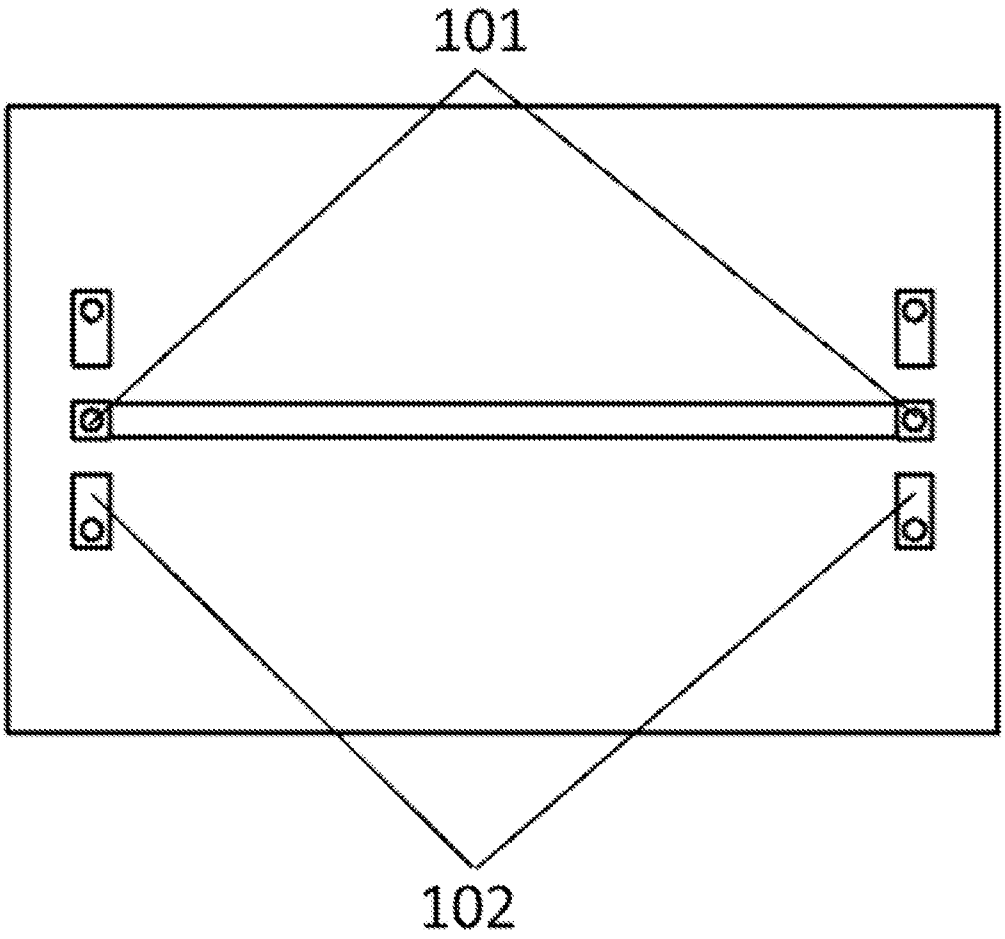
FIG. 1 depicts a front view layout diagram of a bare chip using a back-side wiring IC process.
Figure 2:
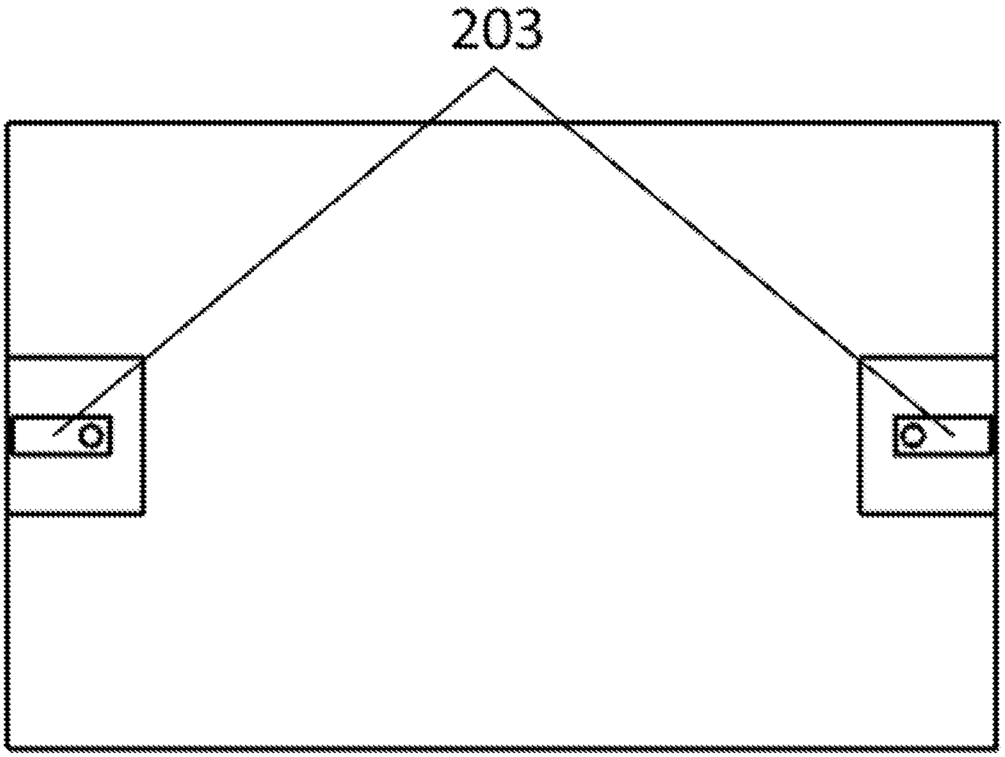
FIG. 2 depicts a back view layout diagram of a bare chip using a back-side wiring IC process.

In the following description, for purpose of explanation, specific details, figures, and exemplary embodiments are set forth in order to provide a better understanding of purposes, characteristics, and benefits of the present invention. It shall be noted that the present invention may, however, be practiced by combining one or more features in the exemplary embodiments, as long as those features are not contradictory.

Described below are technical details for the purpose of full understanding of the present invention. However, the present invention may be implemented using approaches other than the exemplary embodiments described hereinafter. Accordingly, neither of these examples shall be used to limit the scope of the disclosure of the current patent document.

Embodiment 1

With reference to FIGS. 1-6, an embodiment of a high-frequency QFN packaging structure based on a back-side wiring IC process is disclosed. The structure comprises an IC bare chip 509 using a back-side wiring IC process, an RF bonding plate 304 having a protruding section 305, a ground bonding plate 307 with a groove 306, and multiple conductive bonding plates 308. The protruding section of the RF bonding plate extends towards a corresponding groove with a gap in between. An RF connection terminal 101 of the IC bare chip is electrically connected to the protruding section 305 of the RF bonding plate 304 through a back-side RF wiring 203 bonded to the RF bonding plate. Ground connection terminals 102 of the IC bare chip reach the back side metal of the IC chip via metal vias for connections to the ground bounding plate 307. The ground bonding plate surrounds the RF bonding plate to form a Ground-Signal-Ground (GSG) structure.

The high-frequency QFN packaging structure is optimized at an exterior specification of 3 mm*3 mm. In the high-frequency QFN packaging structure, the number of bonding plates is optimized at 12 PIN; the number of RF bonding plates is optimized at 3; the number of the conductive bonding plates is optimized at 3, the size of the RF bonding plates is optimized at 0.66 mm*0.22 mm; and the protruding section of the RF bonding plate is optimized at 0.1 mm in width and 0.23 mm in length.

The exterior size, thickness of the lead frame, thickness of the RF bonding plate, and twelve bonding plates of the high-frequency QFN packaging structure are set in accordance with traditional QFN packaging lead frame. The numbers of the bonding plates and conductive bonding plates, set accordingly based on selections mentioned above, may be used in a wide range of applications, including 2-port devices, such as attenuators and filters, 3-port devices, such as mixers, power splitters, and switches, passive devices, controllable switches, attenuators chips, etc. The size of the RF bonding plates is chosen by simulation in rendering optimal performance under high frequencies.

Figure 3:
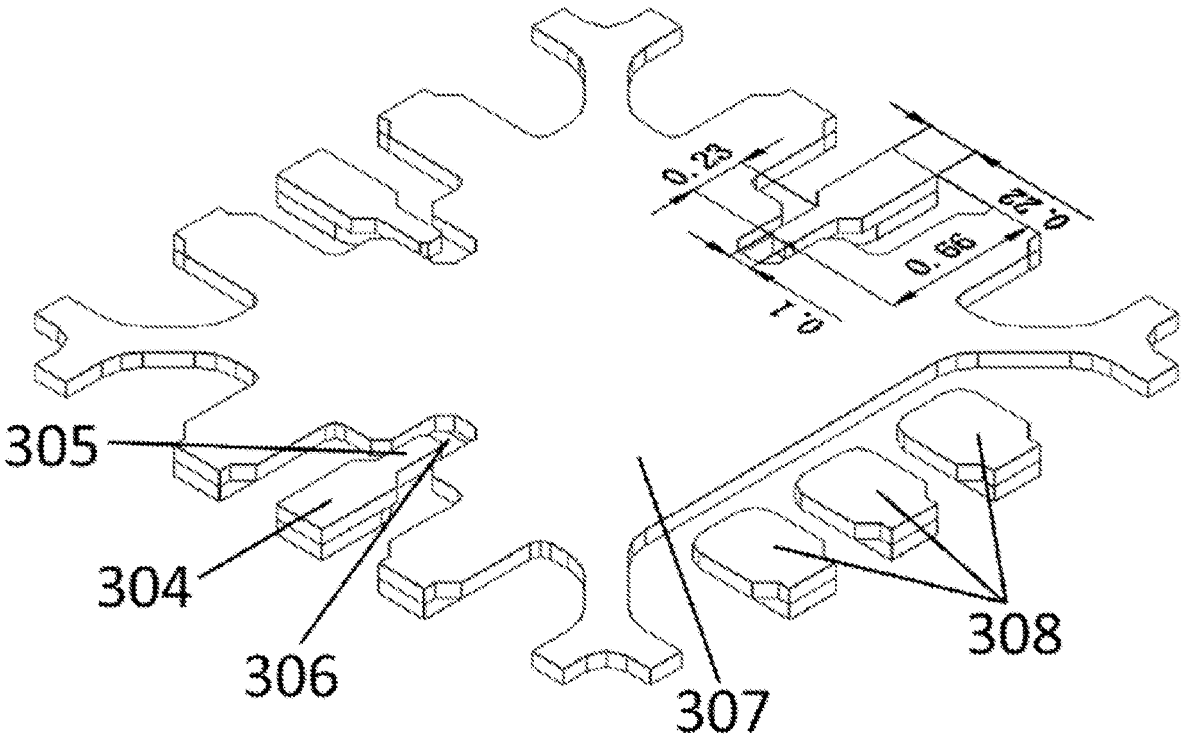
FIG. 3 depicts a front view of a high-frequency QFN packaging structure in exemplary embodiment 1.
Figure 4:
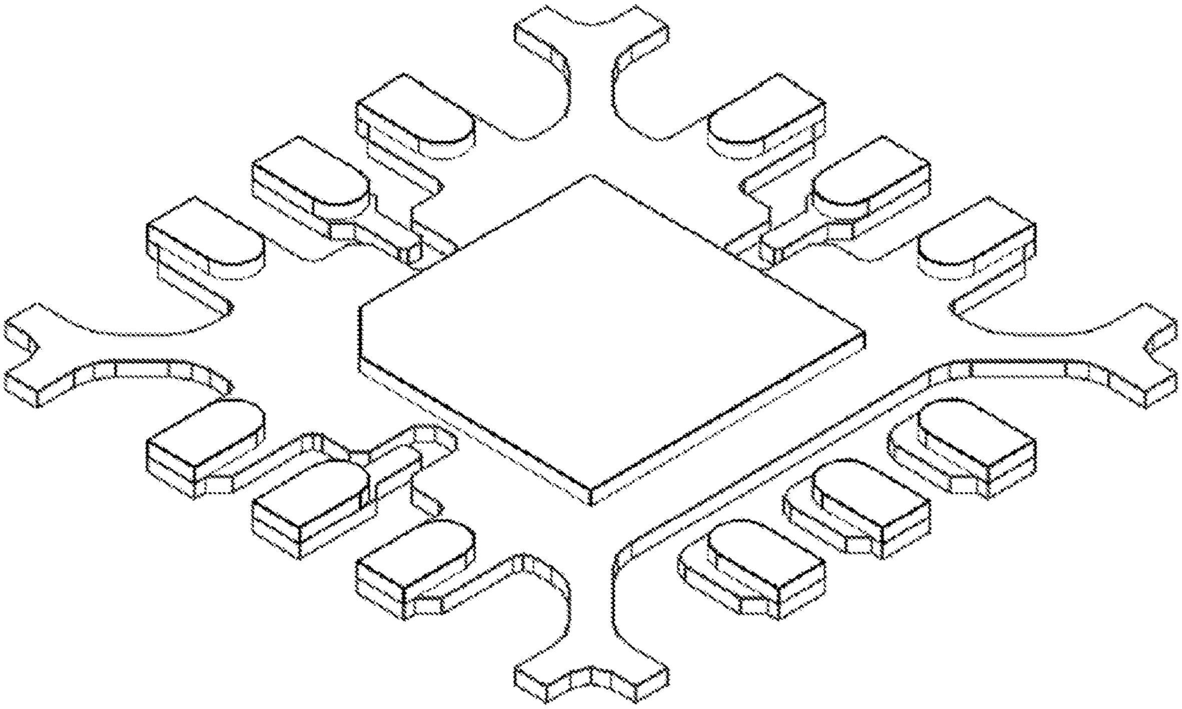
FIG. 4 depicts a back view of the high-frequency QFN packaging structure in exemplary embodiment 1.
Figure 5:
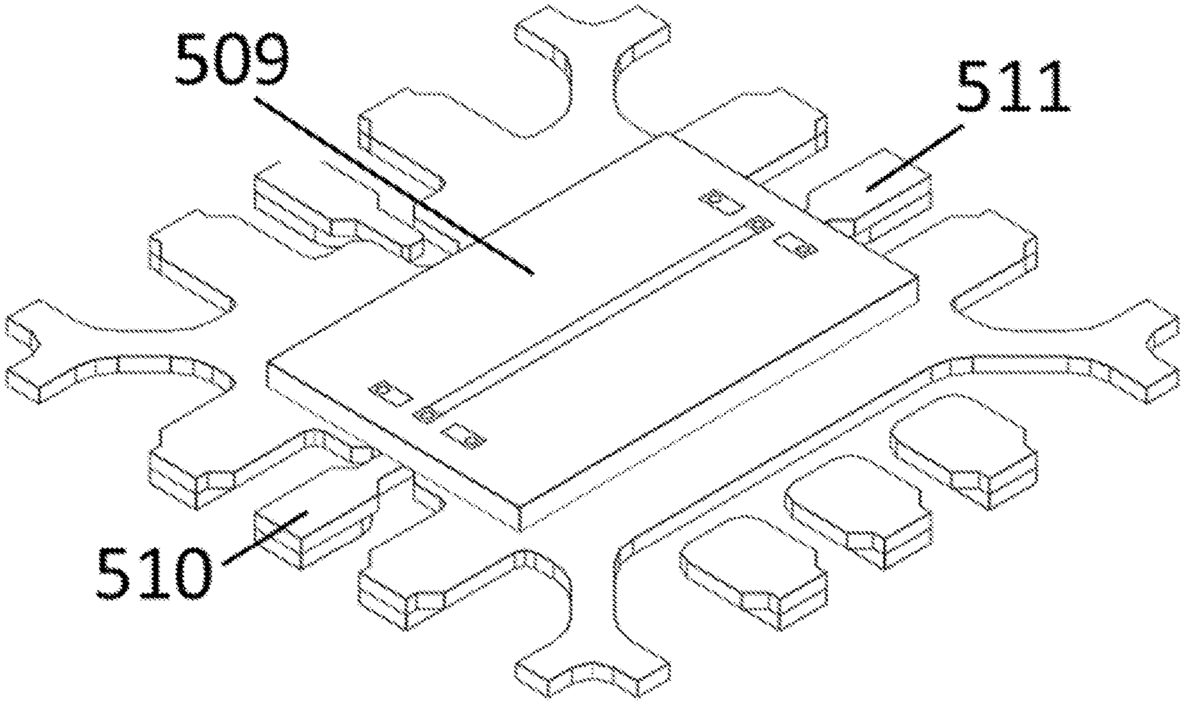
FIG. 5 depicts a structural diagram of a high-frequency QFN packaging structure after the bare chip using a back-side wiring IC process shown in FIG. 1

As demonstrated in FIGS. 3-5, a high-frequency QFN packaging structure using the back-side wiring IC process comprises an IC bare chip having back-side wiring, RF bonding plates with protruding sections, a ground bonding plate having a large area and grooves, and multiple conductive bonding plates. The protruding section of each RF bonding plate is paired with a groove of the ground bonding with a gap of 0.1 mm. The back-side RF wiring of the IC bare chip is electrically connected to the protruding sections of RF bonding plates. The remaining parts on the back side of the IC bare chip are directly bonded to the ground bonding plates.

Because RF connection terminals of the bare IC chip may reach, through metal vias, the back side for wiring and direct connection to the protruding section of the RF bonding plate, the gold wire inductor effect from wire bonding at high frequencies may be avoided. Therefore, the disclosed structure may be used under higher frequencies.

In addition, the Flip Chip process may be omitted to lower processing costs. The metal via for a connection between the RF connection terminal and the back of the IC bare chip, and the ground vias placed on either side of the metal via form a vertical GSG structure, which improves the matching performance for signals at millimeter-wave frequencies.

The high-frequency QFN packaging structure comprises three RF bonding plates and three conductive bonding plates. The three RF bonding plates are located on three separate sides, and the three conductive bonding plates are located on the remaining one side. The three conductive bonding plates are for low-frequency signals and may be connected to the IC bare chips through Wire Bonding. Such a packaging structure may be used on 2-port devices, e.g., attenuators, filters, etc., and 3-port devices, e.g., mixers, power splitters, switches, etc.

The high-frequency QFN packaging structure comprises a large ground bonding plate having grooves, where the protruding sections of the RF bonding plates may be extended and surrounded by the ground bonding plates with a gap of 0.1 mm. As a result, the ground return of the radio frequency signal is shorter in distance, which further improves the electric performance for high-frequency signals.

The materials used for bonding the IC bare chip and the QFN lead frame are conductive epoxy/glue with good electronic and thermal conductivity.

Figure 6:
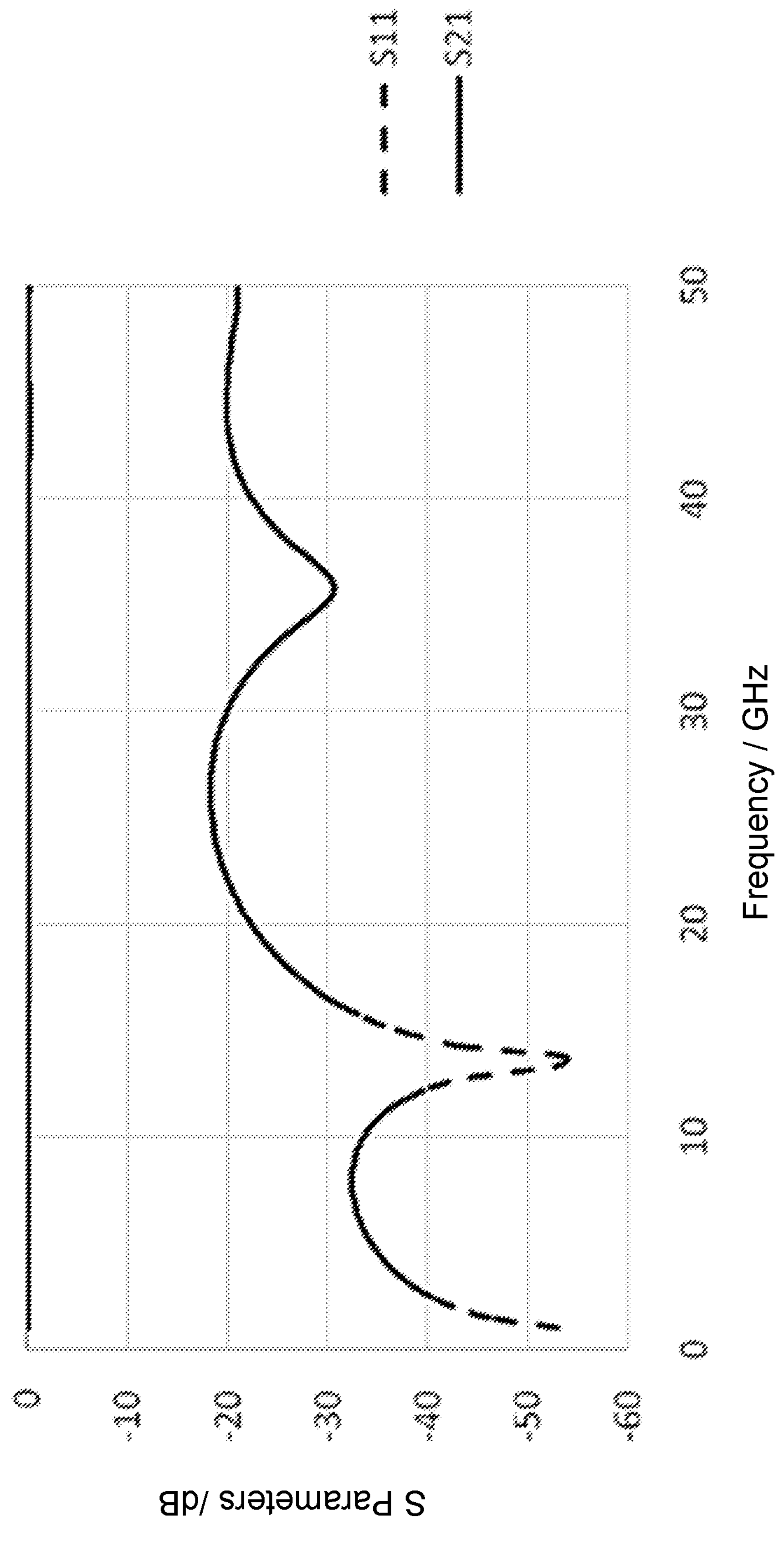
FIG. 6 depicts an S-parameter frequency response plot of the high-frequency QFN packaging structure after the IC bare chip is bonded to the structure shown in FIG. 5.
Figure 7:
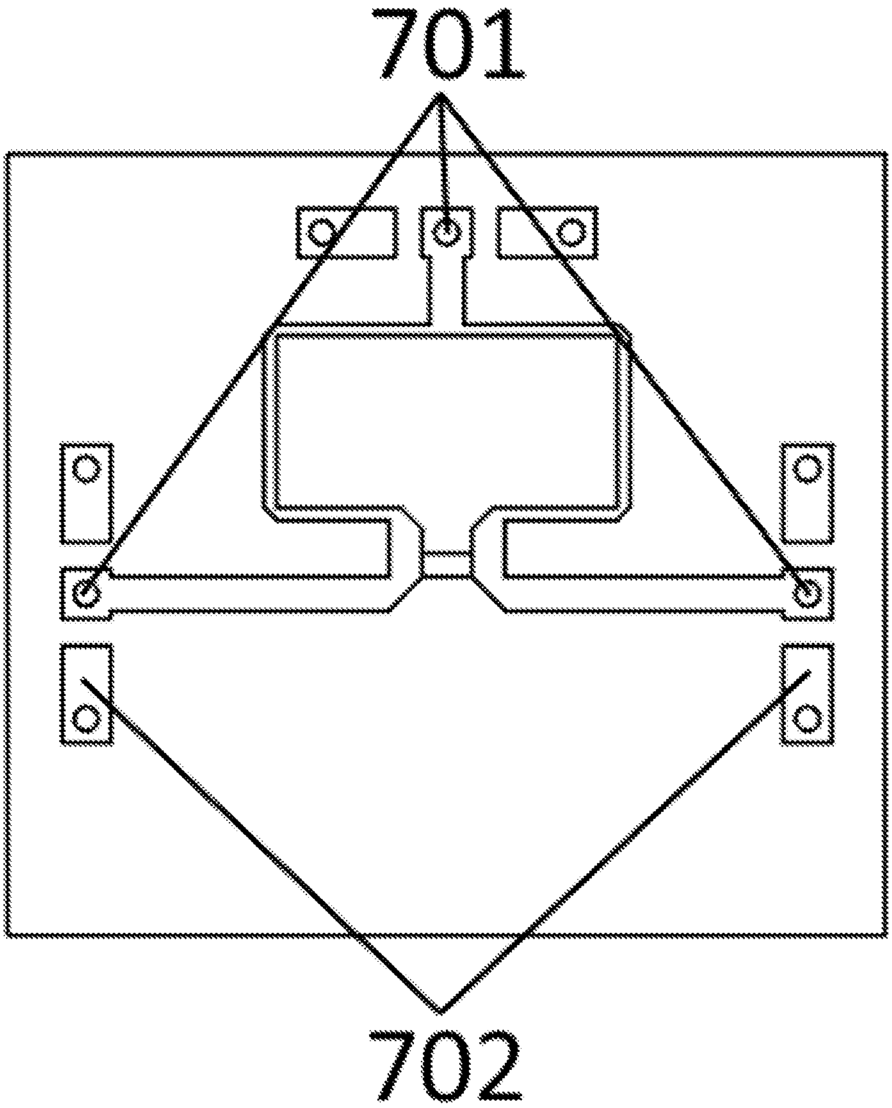
FIG. 7 depicts a front view layout diagram of a power splitter bare chip using a back-side wiring IC process.
Figure 8:
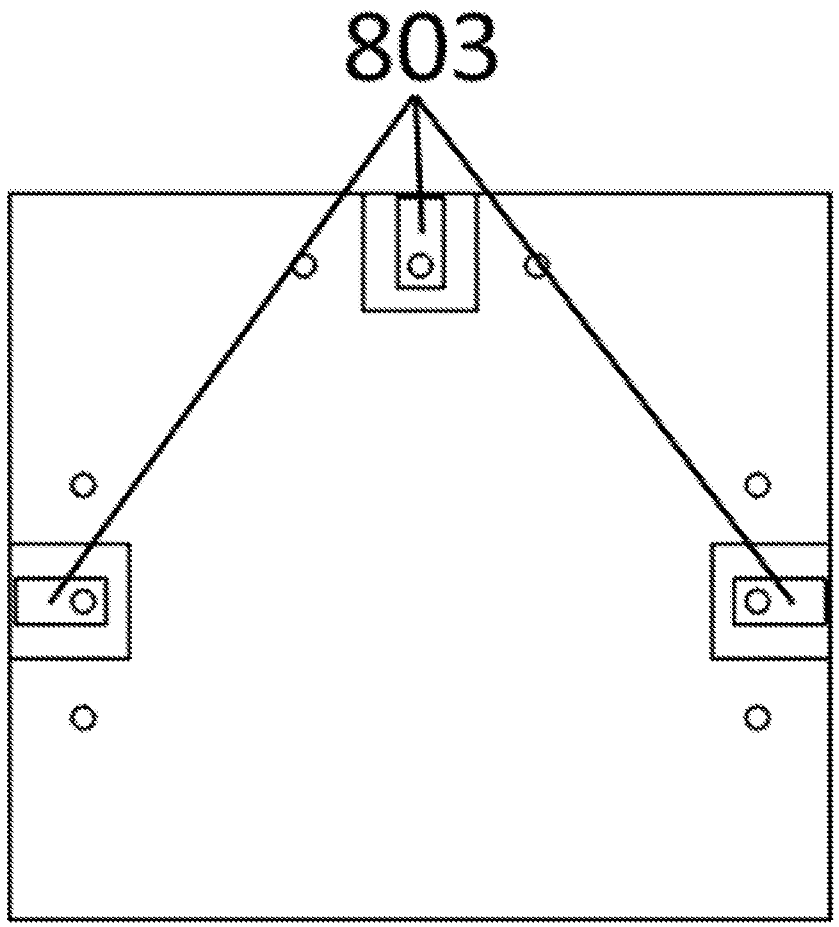
FIG. 8 depicts a back view layout diagram of a power splitter bare chip using a back-side wiring IC process.
Figure 9:
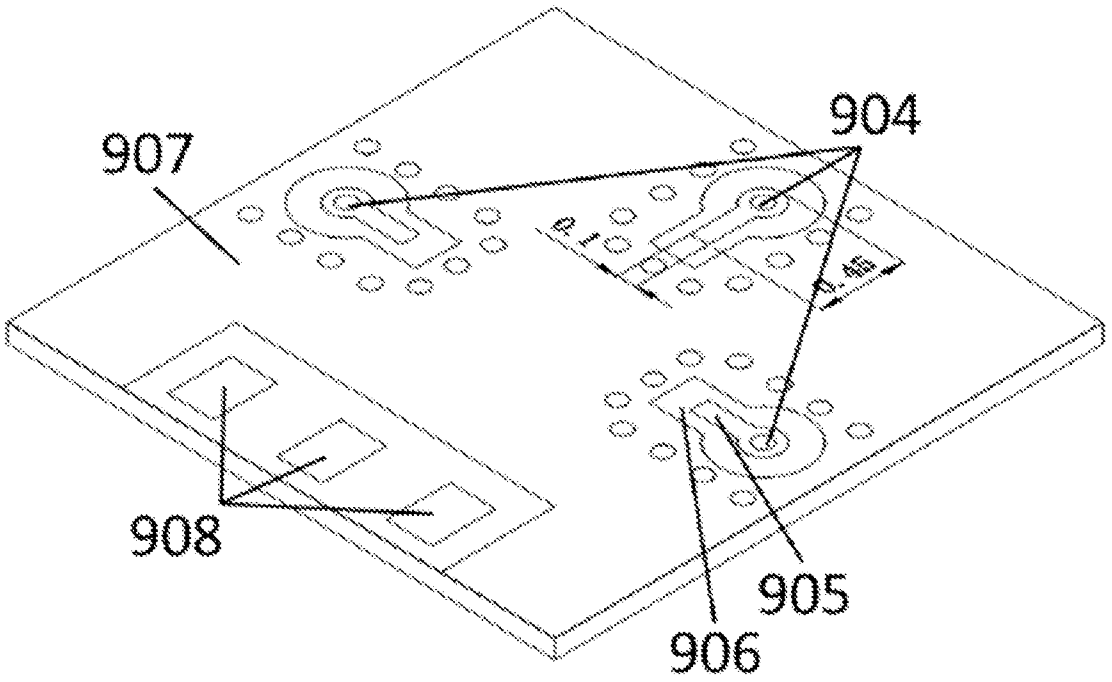
FIG. 9 depicts a front view of a high-frequency substrate packaging structure in exemplary embodiment 2.
Figure 10:
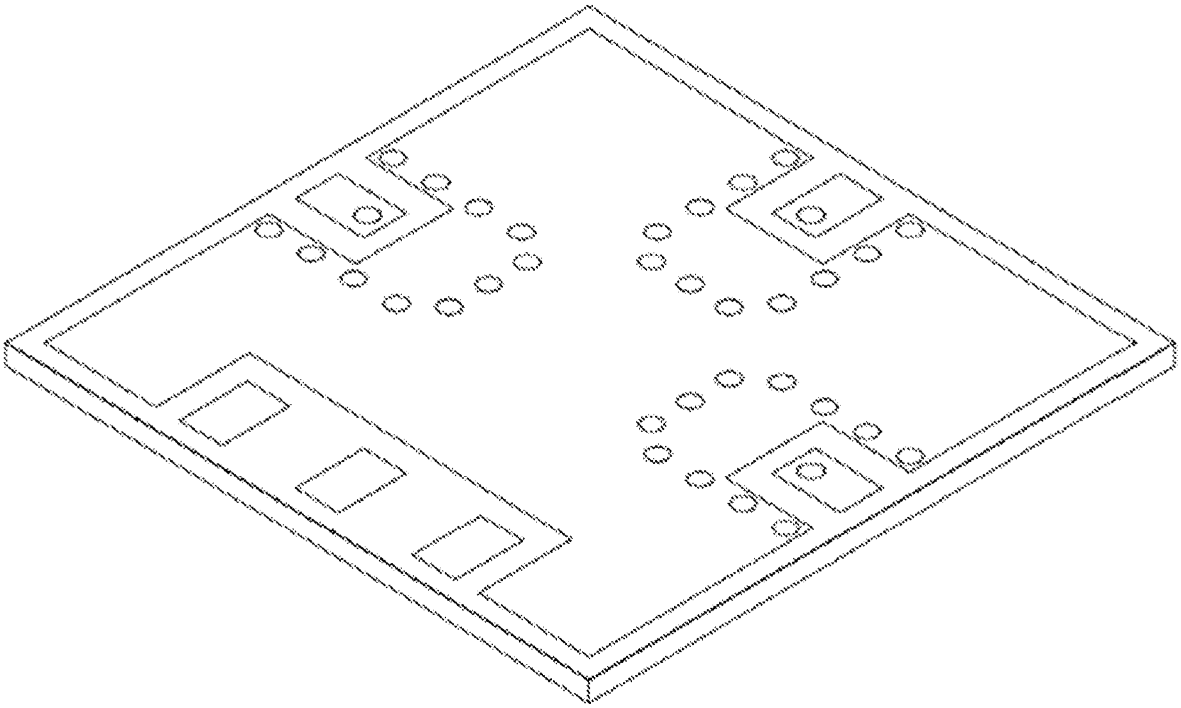
FIG. 10 depicts a back view of a high-frequency substrate packaging structure in exemplary embodiment 2.
Figure 11:
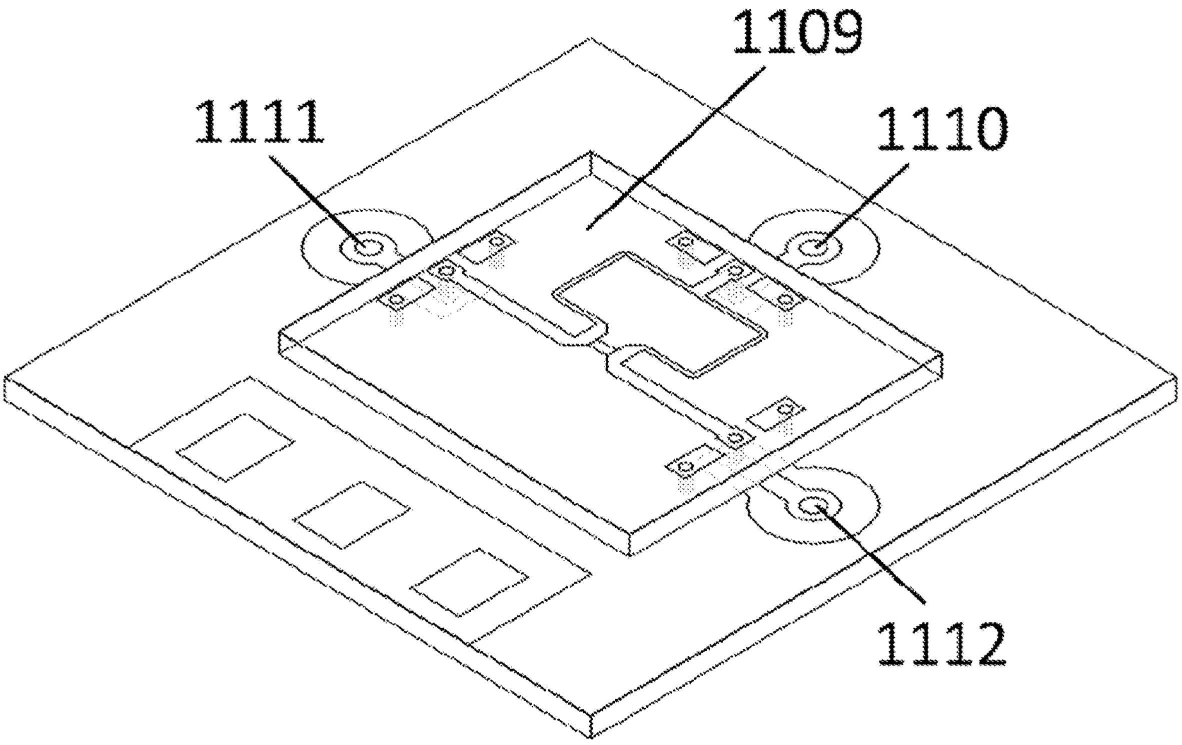
FIG. 11 depicts a structural diagram of the high-frequency substrate packaging structure after the power splitter bare chip using a back-side wiring IC process shown in FIG. 7

The IC bare chip of embodiment 1 of the invention is a microstrip transmission line bare chip, but may be applied to other bare chips such as attenuators, filters, switches, amplifiers etc. FIG. 6 depicts an S-parameter frequency response plot in Embodiment 1, with the x-axis for frequency and the y-axis for S-parameters. Each S-parameter represents an RF performance of a packaging structure. S11 represents a return loss of a first port 510, and S21 represents an insertion loss from a second port 511 to the first port 510.

Embodiment 2

As referenced in FIGS. 7-12, Embodiment 2 in the present invention provides a high-frequency substrate packaging structure using a back-side wiring IC process. The high-frequency substrate packaging structure comprises an IC bare chip 1109 that has back-side wiring, a double-layer substrate, an RF bonding plate 904 having a protruding section 905, a ground bonding plate 907 having grooves 906, and multiple conductive bonding plates 908. The protruding section of the RF bonding plate extends towards a corresponding groove with a gap in between. A top layer of the double-layer substrate is designed to have three RF bonding plates, one large ground bonding plate, and three conductive bonding plates. An RF connection terminal 701 of the IC bare chip is electrically connected to the protruding section 905 of the RF bonding plate 904 through a back-side RF wiring 803 bonded to the RF bonding plate. Ground connection terminals 702 of the IC bare chip reach the back side metal of the IC chip via metal vias for connections to the large ground bounding plate 907. The large ground bonding plate surrounds the RF bonding plate to form a Ground-Signal-Ground (GSG) structure. Each conductive bonding plate is located on both top and bottom layers of the double-layer substrate and connected through a metal via in between.

Wherein, the high-frequency substrate packaging structure is optimized at 3 mm*3 mm for an exterior size. The substrate in the high-frequency substrate packaging structure has a double-layer structure favorably using low loss material with 0.1 mm thickness. The number of bonding plates is optimized to 12 PIN; the number of RF bonding plates is optimized at 3; the number of conductive boning plates is optimized at 3. The optimal size of the RF bonding plates is 0.45 mm*0.1 mm.

The exterior size, material, thickness, and twelve bonding plates of high-frequency substrate packaging structure are set in accordance with a selection of substrate packaging frames. The numbers of the bonding plates and conductive bonding plates, set accordingly based on optimal numbers mentioned above, may be used in a wide range of applications, including 2-port devices, such as attenuators and filters, 3-port devices, such as mixers, power splitters, and switches, passive devices, controllable switches, attenuators chips, etc. The size and diameter of the RF bonding plates are chosen by simulation in rendering optimal performance under high frequencies.

A high-frequency substrate packaging structure is disclosed, as shown in FIG. 7-FIG. 12. The high-frequency substrate packaging structure comprises an IC bare chip having back-side wiring and a double-layer substrate. The top layer of the double-layer substrate comprises three RF bonding plates, one large-area ground bonding plate, and three conductive bonding plates. The back-side RF wiring of the IC bare chip is bonded to the protruding sections of the RF bonding plates for electrical connection. The remaining parts on the back side of the IC bare chip are directly bonded to the large-area ground bonding plate.

Because RF connection terminals of IC bare chip may reach, through metal vias, the back side for wiring and bonding to the RF bonding plates, the gold wire inductor effect of Wire Bonding under high frequencies may be avoided. Therefore, such a structure can be used for higher frequencies. Similarly, the Flip Chip process may be omitted to save processing costs. The metal vias connecting the RF connection terminal and the back of the IC bare chip, along with the ground vias on either side, form a vertical GSG structure, which improves the matching performance for signals at millimeter wave frequencies.

The high-frequency substrate packaging adopts a double-layer substrate which uses 0.1 mm thick low loss material. The top layer of the double-layer substrate has three RF bonding plates and three conductive bonding plates. These six bonding plates are surrounded by a large-area ground bonding plate. The three RF bonding plates are located on 3 separate sides of the ground bonding plate, and the three conductive bonding plates are located on the remaining one side of the ground bonding plate. The three conductive bonding plates are for low-frequency signals, and may connect to the IC bare chips through Wire Bonding. Such a packaging structure may be used on 2-port devices, such as attenuators and filters, and 3-port devices, such as mixers, power splitters, and switches.

The high-frequency substrate packaging structure has large-area ground bonding plates surrounding RF bonding plates. As a result, the ground return of the RF signal is shorter in distance, thus further improving the electric performance for high-frequency signals.

The materials used for bonding the IC bare chip and top layer of the double-layer substrate are conductive epoxy/glue with good electronic and thermal conductivity.

The IC bare chip of embodiment 2 of the invention is a power splitter bare chip, but may be applied to other bare chips such as mixers, switches etc.

Figure 12:
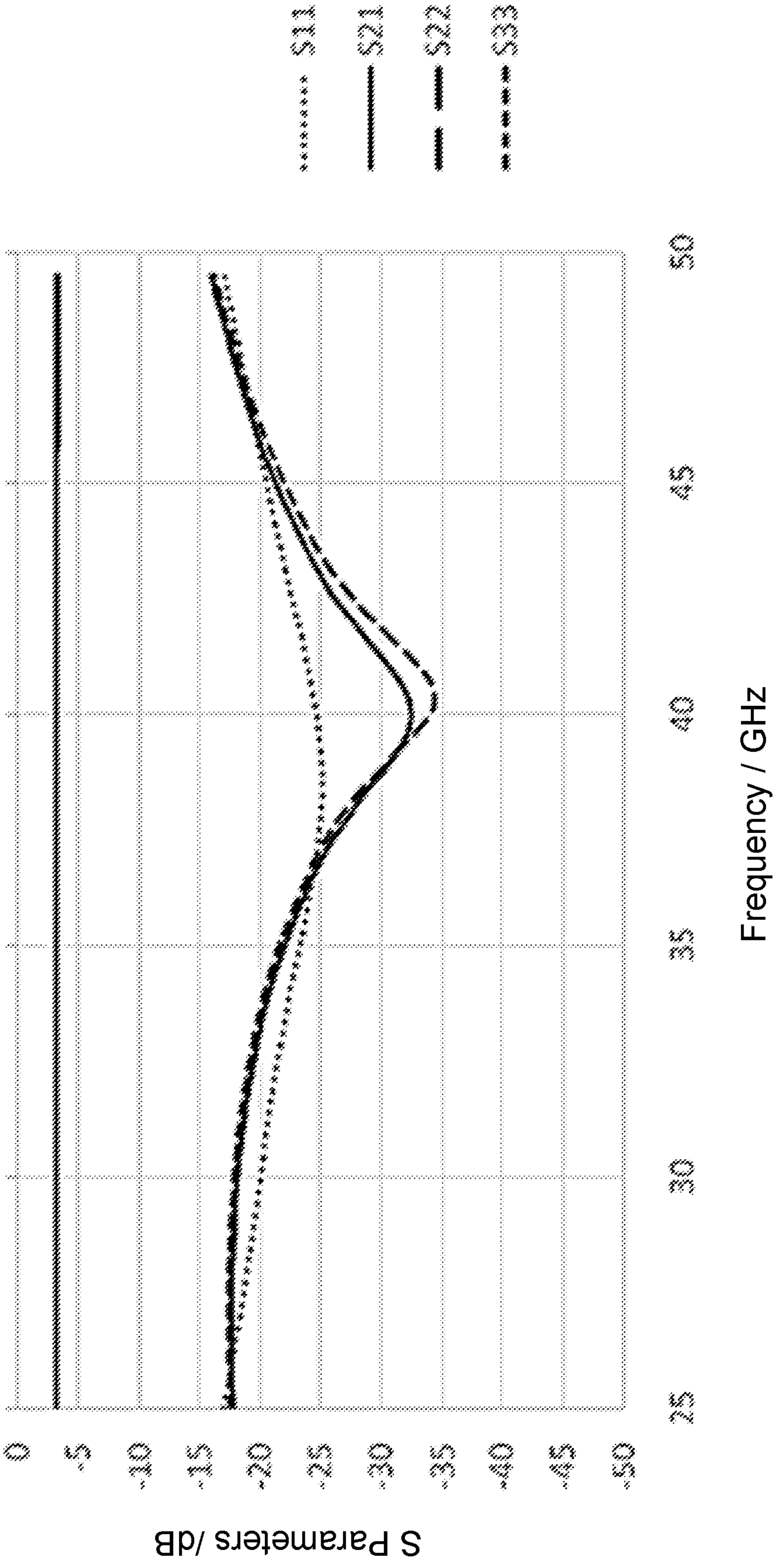
FIG. 12 depicts an S-parameter frequency response plot of the high-frequency substrate packaging structure after the power splitter bare chip is bonded on the substrate shown in FIG. 11.

FIG. 12 depicts an S-parameter frequency response plot in Embodiment 2, with the x-axis for frequency and the y-axis for S-parameters. Each S-parameter represents an RF performance of a packaging structure, with S11 representing a return loss of the first port 1110, S21 representing an insertion loss from the second port 1111 to the first port 1110, S22 representing a return loss of the second port 1111, and S33 representing a return loss of the third port 1112.

Although the foregoing embodiment of the invention has been described for purposes of clarity and understanding, one skilled in the art can, with appreciation of the innovative conception of the present invention, make alterations and modifications to the embodiments provided. Therefore, the claims in the present document shall be interpreted as including those disclosed embodiments and all permutations and modifications within the scope of the present invention.

It will be appreciated to those skilled in the art that various permutations and modifications for the present invention may be made for the present invention within the true spirit and scope of the present invention. Accordingly, if those permutations and modifications are within the equivalent technical scope of the claims of the present invention, those permutations and modifications shall also be included within the present invention.

The invention claimed is:

1. A chip packaging structure comprising:
- a chip;
- at least one radio frequency (RF) bonding plate; and
- a ground bonding plate;
- wherein the ground bonding plate has at least one groove corresponding to each RF bonding plate, each RF bonding plate has a main section and a protruding section that extends with a gap into one of the at least one groove, the chip comprises an RF connection terminal, on a front side of the chip, reaching a back-side RF wiring of the chip through an RF metal via and connecting to the protruding section of each RF bonding plate, the chip comprises a ground connection terminal, on the front side of the chip, reaching back side metal of the chip through a metal via and connecting to the ground bonding plate.

2. The chip packaging structure of claim 1 wherein two grounding metal vias connecting to the ground bonding plate are disposed in proximity of both sides of the RF metal via respectively, and forming a Ground-Signal-Ground (GSG) structure in a vertical orientation.

3. The chip packaging structure of claim 1 further comprising a lead frame or a substrate, the RF bonding plate and the ground bonding plate are located on the lead frame or the substrate, the chip is attached to the lead frame or the substrate.

4. The chip packaging structure of claim 3 further comprising:
- a conductive bonding plate located on the lead frame or the substrate, the conductive bonding plate is used to provide bias supply or logic control for the chip.

5. The chip packaging structure of claim 3 wherein the substrate is a double-layer substrate, the at least one RF bonding plate and the ground bonding plate are displaced on a top layer of the double-layer substrate.

6. The chip packaging structure of claim 1 wherein the at least one RF bonding plate comprises three RF bonding plates and the at least one groove comprises three grooves corresponding to the three RF bonding plates respectively.

7. The chip packaging structure of claim 6 further comprising:
- one or more conductive bonding plates, the three RF bonding plates respectively face to three out of four sides of the chip packaging structure, the one or more conductive bonding plates face to a rest of the four sides of the chip packaging structure.

8. The chip packaging structure of claim 7 wherein the number of conductive bonding plates is one or more.

9. The chip packaging structure of claim 1 wherein the protruding section of the RF bonding plate extends towards a center of the ground bonding plate.

10. The chip packaging structure of claim 4 wherein there is a gap between the conductive bonding plate and the ground bonding plate.

11. The chip packaging structure of claim 1 wherein the ground bonding plate and the RF bonding plate form a Ground-Signal-Ground (GSG) structure.

12. A method for chip packaging, the method comprising:
given a chip comprising a radio frequency (RF) connection terminal on a front side of the chip reaching, through an RF metal via, a back-side RF wiring of the chip and one or more ground connection terminals on the front side of the chip reaching, through one or more metal vias, back-side metal of the chip, performing steps comprising:
connecting the back-side RF wiring to an RF bonding plate that comprises a protruding section connected to the back-side RF wiring and a main section; and
connecting the back-side metal of the chip to a ground bonding plate that has at least a groove corresponding to the RF bonding plate, the protruding section of the RF bonding plate extends with a gap into the groove.

13. The method of claim 12 wherein the one or more metal vias comprise two grounding metal vias placed in proximity of both sides of the RF metal to form a Ground-Signal-Ground (GSG) structure in a vertical orientation.

14. The method of claim 12 the ground bonding plate and the RF bonding plate form a Ground-Signal-Ground (GSG) structure.

15. The method of claim 12 wherein the RF bonding plate and the ground bonding plate are located on a substrate, the chip is attached to the substrate.

16. The method of claim 15 wherein the substrate is a double-layer substrate, the RF bonding plate and the ground bonding plate are displaced on a top layer of the double-layer substrate.

17. The method of claim 15 further comprising:
providing, via a conductive bonding plate located on the lead frame or the substrate, bias supply or logic control for the chip.

18. The method of claim 17 wherein the conductive bonding plate is for low-frequency signals and connected to the chip through wire bonding.

19. The method of claim 17 wherein the conductive bonding plate and the RF bonding plate face different sides of the ground bonding plate.

20. The method of claim 12 wherein the protruding section of the RF bonding plate extends towards a center of the ground bonding plate.

* * * * *